(12) United States Patent
Kao et al.

(10) Patent No.: US 11,895,832 B2
(45) Date of Patent: Feb. 6, 2024

(54) MEMORY INTEGRATED CIRCUIT

(71) Applicant: Taiwan Semiconductor Manufacturing Company, Ltd., Hsinchu (TW)

(72) Inventors: Yun-Feng Kao, Hsinchu (TW); Ming-Yen Chuang, Hsinchu (TW); Katherine H. Chiang, New Taipei (TW); Chia-En Huang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 209 days.

(21) Appl. No.: 17/395,468

(22) Filed: Aug. 6, 2021

(65) Prior Publication Data

US 2023/0041409 A1 Feb. 9, 2023

(51) Int. Cl.
| | |
|---|---|
| *H01L 29/786* | (2006.01) |
| *G11C 11/40* | (2006.01) |
| *H10B 12/00* | (2023.01) |
| *G11C 11/4091* | (2006.01) |

(52) U.S. Cl.
CPC .......... *H10B 12/50* (2023.02); *G11C 11/4091* (2013.01); *H01L 29/7869* (2013.01); *H10B 12/315* (2023.02)

(58) Field of Classification Search
CPC ...... H10B 12/50; H10B 12/315; H10B 12/01; H10B 12/00; H10B 12/482; G11C 11/4091; G11C 11/06; G11C 11/405; G11C 11/4045; G11C 5/025; G11C 5/06; G11C 5/063; G11C 11/4097; G11C 11/409; G11C 2211/4016; G11C 2211/401; G11C 2211/4062; H01L 29/7869; H01L 29/78696; H01L 29/42368; H01L 29/786
See application file for complete search history.

(56) References Cited

U.S. PATENT DOCUMENTS

| | | | | |
|---|---|---|---|---|
| 6,500,715 B2 * | 12/2002 | Matsuzaki | ............ | H01L 27/088 257/E27.06 |
| 9,698,272 B1 * | 7/2017 | Ikeda | ................ | H01L 29/78642 |
| 2001/0034093 A1 * | 10/2001 | Matsuzaki | ........ | H01L 21/82345 257/E27.06 |

* cited by examiner

*Primary Examiner* — Nikolay K Yushin
(74) *Attorney, Agent, or Firm* — JCIPRNET

(57) ABSTRACT

A memory integrated circuit is provided. The memory integrated circuit includes a first memory array, a second memory array and a driving circuit. The first and second memory arrays are laterally spaced apart, and respectively include: memory cells, each including an access transistor and a storage capacitor coupled to the access transistor; bit lines, respectively coupled to a row of the memory cells; and word lines, respectively coupled to a column of the memory cells. The driving circuit is disposed below the first and second memory arrays, and includes sense amplifiers. Each of the bit lines in the first memory array and one of the bit lines in the second memory array are routed to input lines of one of the sense amplifiers.

20 Claims, 9 Drawing Sheets

MEMORY INTEGRATED CIRCUIT

BACKGROUND

New semiconductor applications are ever changing our lives, from new smartphones, to healthcare, factory automation and artificial intelligence. Memory working in background plays an important role in enabling these technologies, and has drawn considerable interest along with advances in computing architectures and semiconductor technologies. Currently, there are still rooms for further increasing storage capability of memory array in a given area and designing a more area-efficient memory driving circuit for the memory array.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
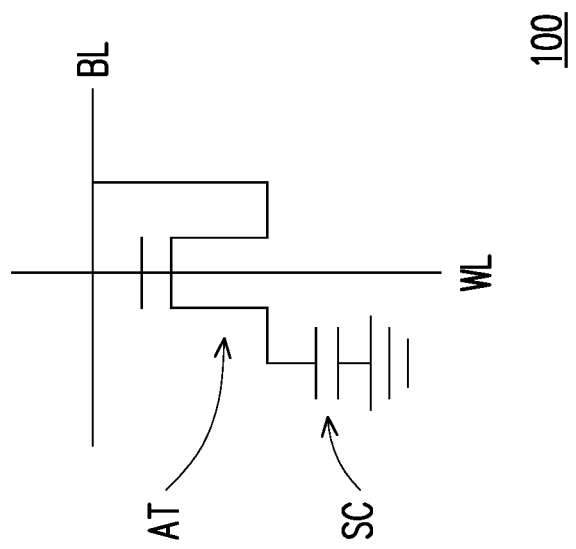
FIG. 1A is a circuit diagram illustrating a memory cell in a memory array, according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a circuit diagram illustrating a memory cell 100 in a memory array, according to some embodiments of the present disclosure.

Referring to FIG. 1A, the memory array may be a dynamic random access (DRAM) array. Each memory cell 100 in the memory array may include an access transistor AT and a storage capacitor SC. The access transistor AT is a field effect transistor (FET). A terminal of the storage capacitor SC is coupled to a source/drain terminal of the access transistor AT, while the other terminal of the storage capacitor SC may be coupled to a reference voltage (e.g., a ground voltage as depicted in FIG. 1A). When the access transistor AT is turned on, the storage capacitor SC can be accessed. On the other hand, when the access transistor AT is in an off state, the storage capacitor SC is inaccessible.

During a write operation, the access transistor AT is turned on by asserting a word line WL coupled to a gate terminal of the access transistor AT, and a voltage applied on a bit line BL coupled to a source/drain terminal of the access transistor AT may be transferred to the storage capacitor SC coupled the other source/drain terminal of the access transistor AT. Accordingly, the storage capacitor SC may be charged or discharged, and a logic state "1" or a logic state "0" can be stored in the storage capacitor SC. During a read operation, the access transistor AT is turned on as well, and the bit line BL being pre-charged may be pulled up or pulled down according to a charge state of the storage capacitor SC. By comparing a voltage of the bit line BL with a reference voltage, the charge state of the storage capacitor SC can be sensed, and the logic state of the memory cell 100 can be identified.

Figure 1B:
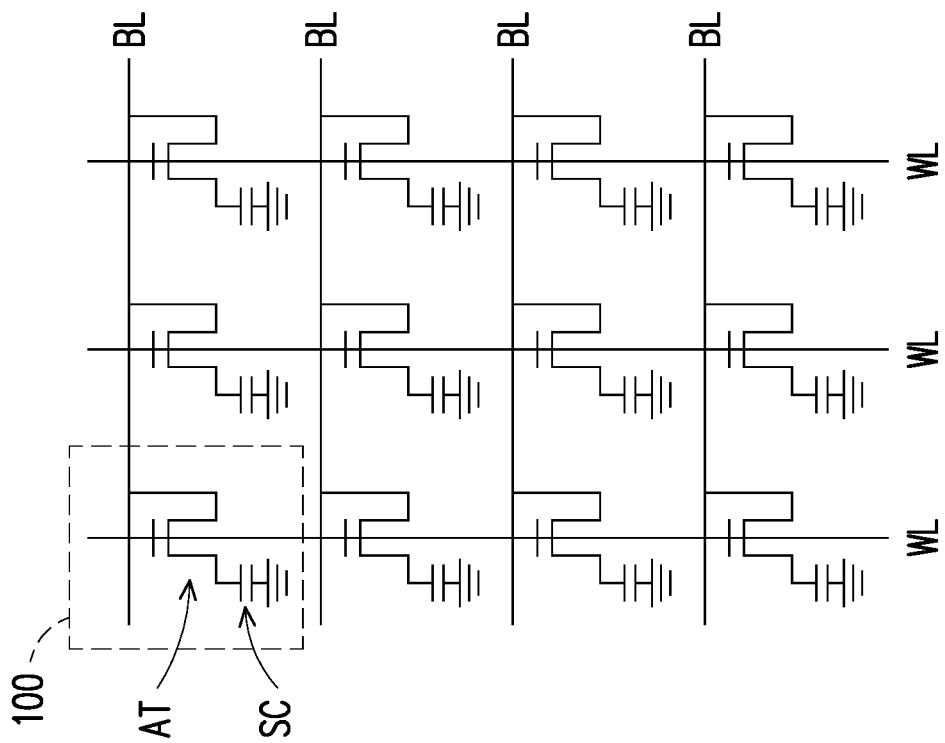
FIG. 1B is a memory array including a plurality of the memory cells as shown in FIG. 1A, according to some embodiments of the present disclosure.

FIG. 1B is a memory array 10 including a plurality of the memory cells 100, according to some embodiments of the present disclosure.

Referring to FIG. 1B, the memory array 10 has rows and columns. The memory cells 100 in each row may be arranged along a direction X, while the memory cells 100 in each column may be arranged along a direction Y intersected with the direction X. A plurality of the bit lines BL may be respectively coupled to a row of the memory cells 100, and may extend along the direction X. On the other hand, a plurality of the word lines WL may be respectively coupled to a column of the memory cells 100, and may extend along the direction Y. In some embodiments, during a write operation, a word line WL coupled to a selected memory cell 100 is asserted, and the storage capacitor SC in the selected memory cell 100 is programmed by a voltage provided to a bit line coupled to the selected memory cell 100. In addition, during a read operation, all of the bit lines BL are pre-charged, and a word line WL coupled to the selected memory cell 100 is asserted, then the pre-charged bit lines BL are further pulled up or pulled down by the storage capacitors SC of the memory cells 100 coupled to the asserted word line WL, respectively. By detecting the voltage variation of a bit line BL coupled to the selected memory cell 100, the logic state of the selected memory cell 100 can be identified. As a result of pulling up/down the pre-charged bit lines BL, the charges stored in the storage capacitors SC of the memory cells 100 coupled to the asserted word line WL are altered. In order to restore logic states of these memory cells 100, the read operation may be followed by a write operation for programming the previous logic states to these memory cells 100, and such write operation may also be referred as a refresh operation.

Figure 2A:
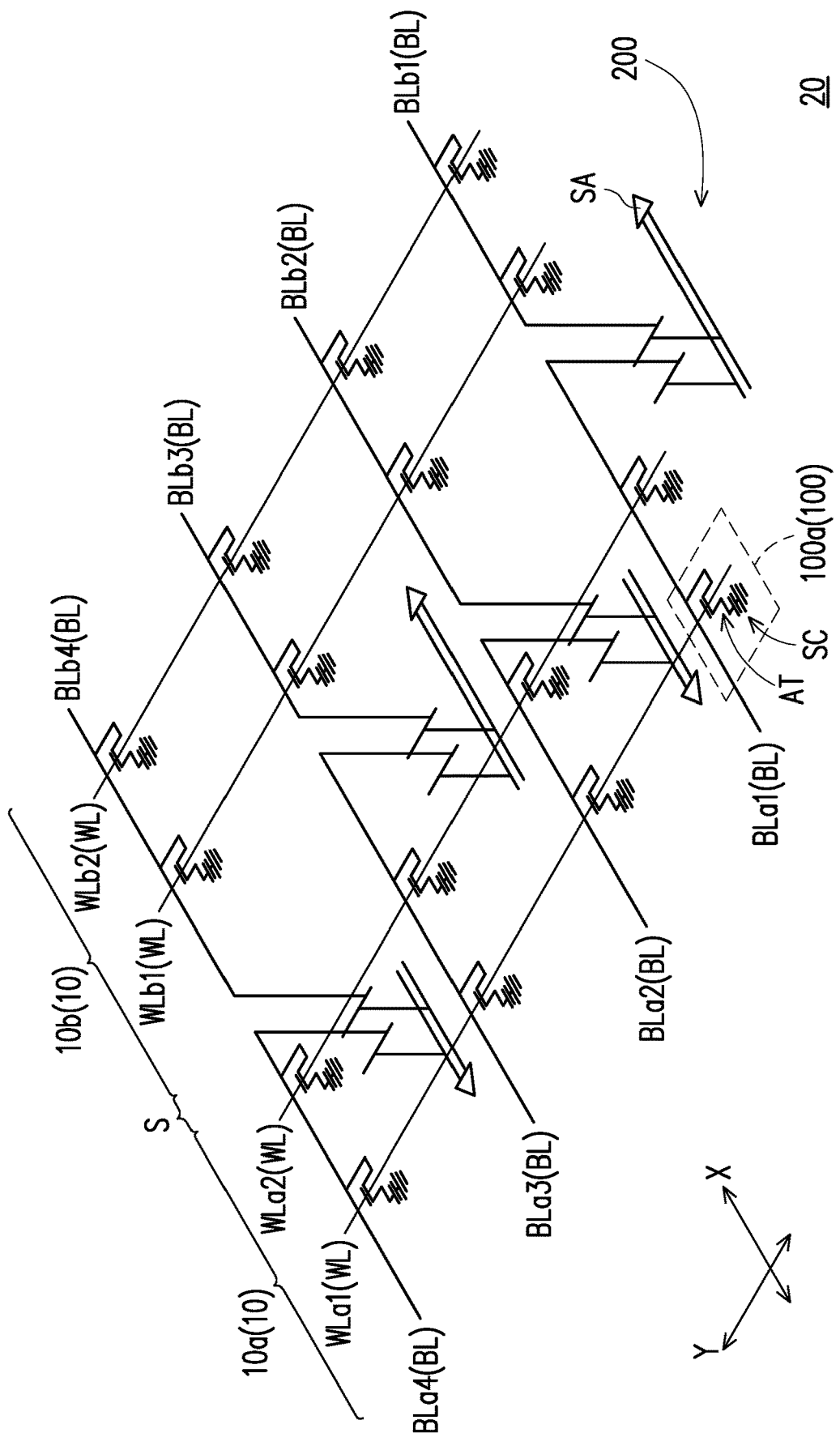
FIG. 2A is a circuit diagram illustrating adjacent ones of the memory arrays and a portion of a driving circuit coupled to the memory arrays, according to some embodiments of the present disclosure.

FIG. 2A is a circuit diagram illustrating adjacent memory arrays 10 and a portion of a driving circuit 200 coupled to the memory arrays 10, according to some embodiments of the present disclosure.

Referring to FIG. 2A, although only two of the memory arrays 10 are depicted, a memory integrated circuit 20 may include more of the memory arrays 10, and these memory arrays 10 may be spaced apart from one another. As shown in FIG. 2A, the two depicted memory arrays 10 are referred as memory arrays 10a, 10b, and are arranged along the direction X with a spacing S in between. In some embodiments, the bit lines BL of the memory array 10a (also referred as bit lines BLa1-BLa4) are substantially aligned with the bit lines BL of the memory array 10b (also referred as bit lines BLb1-BLb4), respectively. Further, the bit lines BLa1-BLa4, BLb1-BLb4 of the memory arrays 10a, 10b are routed to the driving circuit 200 lying under the memory arrays 10. Although not shown, the word lines WL of the memory array 10a (also referred as word lines WLa1, WLa2) as well as the word lines WL of the memory array 10b (also referred as word lines WLb1, WLb2) may be routed to the underlying driving circuit 200 as well. As will be further described with reference to FIG. 2B, the driving circuit 200 is formed on a surface of a semiconductor substrate, while the memory arrays 10 are embedded in a stack of interlayer dielectric layers lying over the driving circuit 200.

The driving circuit 200 includes sense amplifiers SA. The sense amplifiers SA are configured to facilitate read operations. Each sense amplifier SA may include two inputs. One of the inputs is coupled to a bit line BL from the memory array 10a, while the other input is coupled to a bit line BL from the memory array 10b. During a read operation, both bit lines BL coupled to the inputs of a sense amplifier SA are pre-charged to a pre-charging voltage, and one of these bit lines BL would be further pulled up or pulled down by the storage capacitor 120 in a selected memory cell 100, while the other bit line BL still holds at the pre-charging voltage. The sense amplifier SA is configured to output the logic state of the selected memory cell 100 by comparing the voltage on the bit line BL coupled to the selected memory cell 100 with the pre-charging voltage held by the other bit line BL. For instance, when a memory cell 100 in the memory array 10a (e.g., a memory cell 100a) is selected for a read operation, the bit lines BLa1-BL14 from the memory arrays 10a as well as the bit lines BLb1-BLb4 from the memory array 10b are pre-charged to a pre-charging voltage. Further, the word line WLa1 coupled to the selected memory cell 100a is asserted, and the bit line BLa1 coupled to the selected memory cell 100a is further pulled up or pulled down by the storage capacitor SC in the selected memory cell 100a. The bit line BLa1 being further pulled up/down is coupled to an input of one of the sense amplifiers SA, and another input of this sense amplifier SA is coupled to a bit line BLb1 from the memory array 10b. During such read operation, none of the word lines WLb1, WLb2 in the memory array 10b is asserted, thus the bit line BLb1 from the memory array 10b is prevented from being further pulled up/down, thus still holds at the pre-charging voltage. This sense amplifier SA compares the voltage at the bit line BLa1 coupled to the selected memory cell 100a with the pre-charging voltage held by the bit line BLb1, and identify the logic state of the selected memory cell 100a.

Figure 2B:
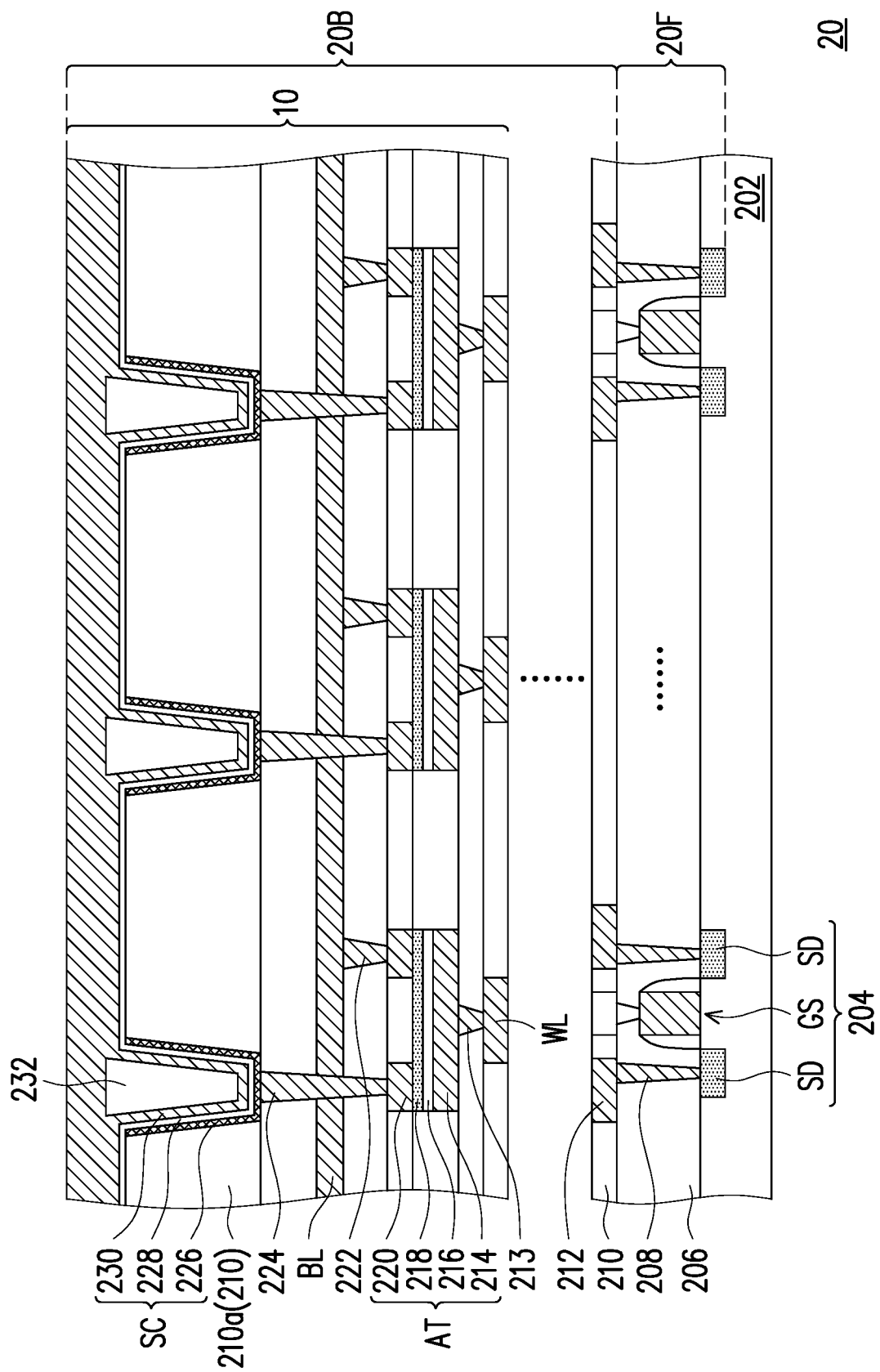
FIG. 2B is a schematic cross-sectional view illustrating a memory integrated circuit including the memory arrays and the driving circuit, according to some embodiments of the present disclosure.

FIG. 2B is a schematic cross-sectional view illustrating the memory integrated circuit 20, according to some embodiments of the present disclosure.

Referring to FIG. 2A and FIG. 2B, the memory integrated circuit 20 includes a front-end-of-line (FEOL) structure 20F formed on a semiconductor substrate 202. The semiconductor substrate 202 may be a semiconductor wafer (e.g., a silicon wafer) or a semiconductor-on-insulator (SOI) wafer (e.g., a silicon-on-insulator wafer). The FEOL structure 20F may include active devices as logic components in the driving circuit 200 described with reference to FIG. 2A. These active devices may include transistors 204, such as metal-oxide-semiconductor field effect transistors (MOSFETs). The transistors 204 may respectively include a gate structure GS and a pair of source/drain structures SD at opposite sides of the gate structure GS. As an example, the transistors T may be planar type MOSFETs, and each gate structure GS is formed on a planar portion of the semiconductor substrate 202. In addition, the source/drain structures SD may be doped regions formed in the semiconductor substrate 202 or epitaxial structures formed in recesses at a surface of the semiconductor substrate 202. Alternatively, the transistors T may be fin type MOSFETs or gate-all-around (GAA) MOSFETs, and three-dimensional channel structures (e.g., fin structures, nanosheets or the like) may be formed on the semiconductor substrate 202. The gate structures GS may cover and intersect with these three-dimensional channel structures, and the source/drain structures SD may be in lateral contact with the three-dimensional channel structures. Further, the FEOL structure 20F may also include a dielectric layer 206 and contact plugs 208 formed in the dielectric layer 206. The dielectric layer 206 covers the semiconductor substrate 202 and the transistors 204, and the contact plugs 208 extend from a top surface of the dielectric layer 206 to the gate structures GS and the source/drain structures SD of the transistors 204, in order to establish electrical contact with the transistors 204.

A back-end-of-line (BEOL) structure 20B of the memory integrated circuit 20 is formed on the FEOL structure 20F. The BEOL structure 20B may include a stack of interlayer dielectric layers 210. For conciseness, only the bottommost one of the interlayer dielectric layers 210 is labeled in FIG. 2B. The memory arrays 10 described with reference to FIG. 2A are embedded in the stack of interlayer dielectric layers 210, and three of the memory cells 100 arranged along a row in a memory array 10 are depicted in FIG. 2B. Routing elements 212 may spread in the stack of interlayer dielectric layers 210. A portion of the routing elements 212 may be configured to interconnect the transistors 204 formed in the underlying FEOL structure 20F, and may be formed in bottommost ones of the interlayer dielectric layers 210. The transistors 204 as well as the contact plugs 208 and the routing elements 212 for interconnecting the transistors 204 may form at least a portion of the driving circuit 200 as described with reference to FIG. 2A. In addition, as will be further described with reference to FIG. 2C, another portion of the routing elements 212 may be configured to connect the bit lines BL and word lines WL in the memory arrays 10 to the driving circuit 200 formed in the FEOL structure 20F and a bottom portion of the BEOL structure 20B. In some embodiments, the routing elements 212 include conductive lines and conductive vias. The conductive lines may each laterally extend in one of the interlayer dielectric layers 210. Although not shown, the conductive vias may each vertically penetrate through one or more of the interlayer dielectric layers 210, to establish electrical contact with one or more of the conductive lines.

The memory arrays 10 may be disposed in some of the interlayer dielectric layers 210, and are routed to the FEOL structure 20F through a portion of the routing elements 212 spreading between the memory arrays 10 and the FEOL structure 20F. In some embodiments, the access transistor AT of each memory cell 100 is disposed on one of the word lines WL, and connected to one of the bit lines BL and one of the storage capacitors SC lying above. In these embodiments, the access transistor AT of each memory cell 100 may include a back gate layer 214, a gate dielectric layer 216, a channel layer 218 and a pair of source/drain structures 220. The back gate layer 214 lies above the word line WL, and may be connected to the underlying word line WL through a conductive via 213. The gate dielectric layer 216 is sandwiched between the back gate layer 214 and the channel layer 218, such that the back gate layer 214 can be capacitively coupled to the channel layer 218 through the gate dielectric layer 216. The source/drain structures 220 are disposed on the channel layer 218, and are laterally spaced apart from each other that the word line WL can be located in between. One of the source/drain structures 220 may be connected to the overlying bit line BL through a conductive via 222, and the other source/drain structure 220 may be connected to the overlying storage capacitor SC through another conductive via 224. In some embodiments, the bit line BL extends between the access transistor AT and the storage capacitor SC. Although the conductive via 224 connecting one of the source/drain structures 218 to the overlying storage capacitor SC is depicted as penetrating through the bit line BL, such conductive via 224 is actually spaced apart and electrically isolated from the bit line BL. In some embodiments, the access transistors AT are laterally spaced apart from one another. In these embodiments, the access transistors AT may be formed as discrete stacking structures each including one of the back gate layers 214, one of the gate dielectric layers 216, one of the channel layers 218 and a pair of the source/drain structures 220.

The channel layers 218 are formed of a semiconductor material. In some embodiments, the semiconductor material includes an oxide semiconductor material. For instance, the oxide semiconductor material may be selected from one or combinations of indium-gallium-zinc oxide (IGZO), indium tin oxide (ITO), indium oxide (e.g., $In_2O_3$), gallium oxide (e.g., $Ga_2O_3$), zinc oxide (e.g., ZnO), aluminum doped zinc oxide (AZO), indium tungsten oxide (IWO), titanium oxide ($TiO_x$) or other oxide semiconductor materials including group III and/or group V element(s).

In some embodiments, the storage capacitors SC respectively include a bottom electrode layer 226. In addition, the storage capacitors SC may share a common capacitor dielectric layer 228 and a common top electrode 230. Discrete openings may be formed in one of the interlayer dielectric layers 210 (referred as an interlayer dielectric layer 210a). Each of the bottom electrode layers 226 may conformally cover a bottom surface and a sidewall of one of these openings, and is in contact with an underlying conductive via 224. The bottom electrode layers 226 are separately filled in these openings, thus can be electrically isolated from one another. The capacitor dielectric layer 228 globally covers the interlayer dielectric layer 210a and the bottom electrode layers 226. In some embodiments, the capacitor dielectric layer 228 conformally covers the interlayer dielectric layer 210a and the bottom electrode layers 226, and may define recesses in the openings of the interlayer dielectric layer 210a. The top electrode 230 is provided on the capacitor dielectric layer 228, and may fill into the recesses defined in the openings of the interlayer dielectric layer 210a by the capacitor dielectric layer 228, to be capacitively coupled to the bottom electrode layers 226 through portions of the capacitor dielectric layer 228 in between. In some embodiments, insulating plugs 232 are formed in the top electrode 230. The insulating plugs 232 are respectively inserted in one of the openings of the interlayer dielectric layer 210a, and are wrapped by the top electrode 230. In these embodiments, the top electrode 230 may have a lining portion conformally lining along entire surface of the capacitor dielectric layer 228, and wrapping the insulating plugs 232. A top end of this lining portion of the top electrode 230 may be substantially coplanar with top surfaces of the insulating plugs 232. In addition, the top electrode 230 may also have a top portion extending upwardly from the top end of the lining portion, and covering the top surfaces of the insulating plugs 232.

Although not shown, the BEOL structure 20B may include more of the interlayer dielectric layers 210 stacking on the common top electrode 230 of the storage capacitors SC, as well as additional routing elements 212 spreading in these interlayer dielectric layers 210.

Figure 2C:
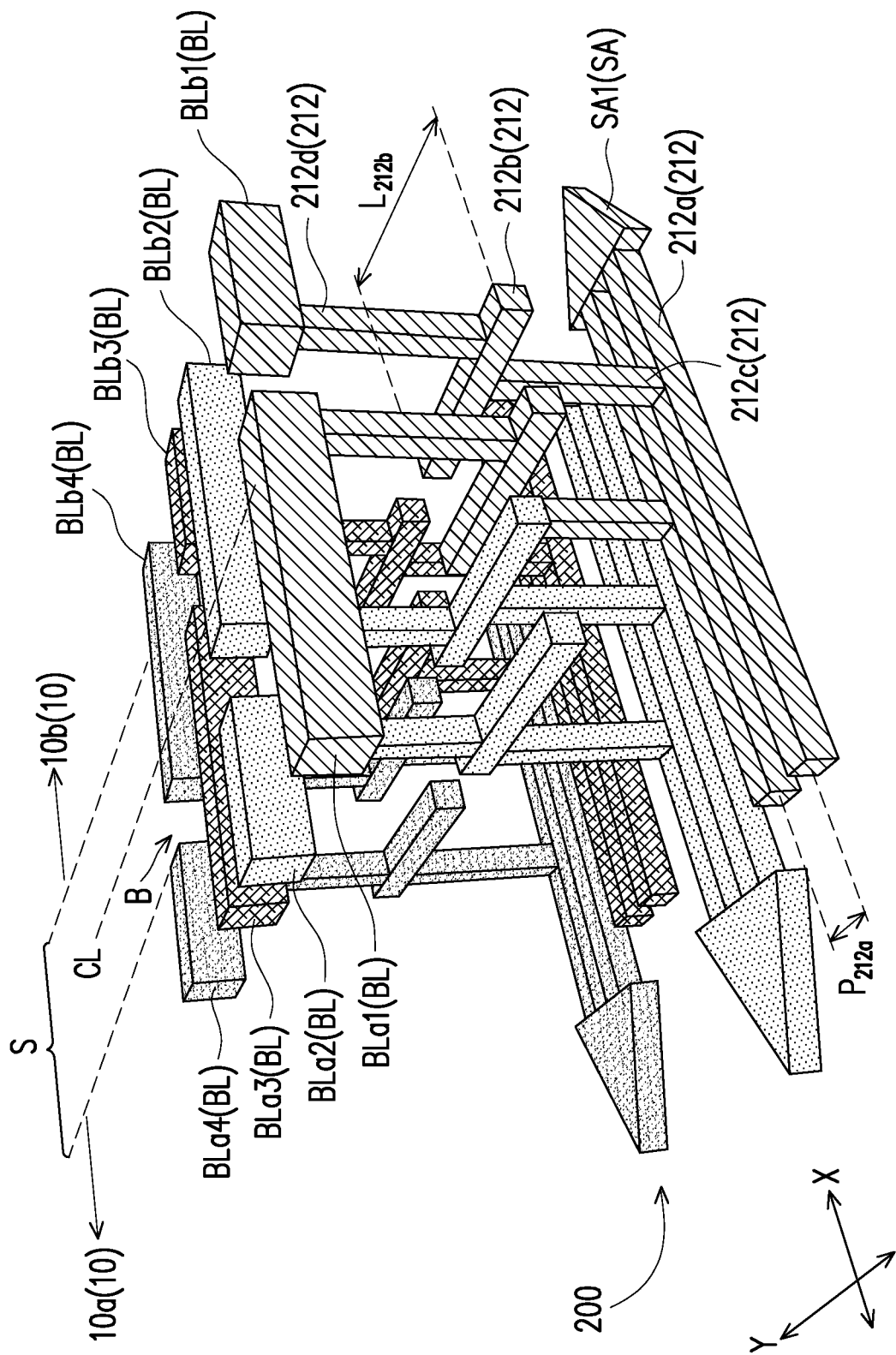
FIG. 2C is a schematic three-dimensional view illustrating a routing scheme for connecting bit lines in the adjacent memory arrays to sense amplifiers in the driving circuit lying below the memory arrays, according to some embodiments of the present disclosure.

FIG. 2C is a schematic three-dimensional view illustrating a routing scheme for connecting the bit lines BL of adjacent memory arrays 100 to the sense amplifiers SA in the driving circuit 200 lying below the memory arrays 10, according to some embodiments of the present disclosure.

Referring to FIG. 2A and FIG. 2C, the bit lines BL of the memory array 10a (e.g., the bit lines BLa1-BLa4) are laterally spaced apart from the bit lines BL of the memory array 10b (e.g., the bit lines BLb1-BLb4). The bit lines BL of the memory array 10a are routed to the underlying driving circuit 200 from end portions reaching to the spacing S between the memory arrays 10a, 10b. Similarly, the bit lines BL of the memory array 10b are routed to the underlying driving circuit 200 from end portions reaching to the spacing S between the memory arrays 10a, 10b. Each bit line BL of the memory array 10a and one of the bit lines BL of the memory array 10b are routed to a sense amplifier SA in the driving circuit 200. One of the bit lines BL connected to an input of a sense amplifier SA provides a reference voltage, and the sense amplifier SA is configured to compare a voltage on the other one of the bit lines BL with the reference voltage, and output a comparison result. In those embodiments where the bit lines BL of the memory array 10a are substantially aligned with the bit lines BL of the memory array 10b, each bit line BL of the memory array 10a and the aligned bit line BL of the memory array 10b are coupled to inputs of the same sense amplifier SA. For instance, the bit line BLa1 of the memory array 10a is routed to an input of one of the sense amplifiers SA (referred as a sense amplifiers SA1), and the bit line BLb1 of the memory array 10b aligned with the bit line BLa1 is routed to the other input of the sense amplifier SA1. If a memory cell 100 in the memory array 10a coupled to the bit line BLa1 is selected for a read operation, the sense amplifier SA1 compare the voltage on the bit line BLa1 with a reference voltage provided by the bit line BLb1, and output a logic state of this memory cell 100. The sense amplifiers SA are arranged along boundaries of the memory arrays 10a, 10b that are facing each other, and may be located at opposite sides of the spacing S between the memory arrays 10a, 10b. In some embodiments, some of the sense amplifiers SA are located under the memory array 10a, while others of the sense amplifiers SA are located under the memory array 10b. For instance, the sense amplifier SA connected to the bit lines BLa1, BLb1, the sense amplifier SA connected to the bit lines BLa2, BLb2, the sense amplifier SA connected to the bit lines BLa3, BLb3 and the sense amplifier SA connected to the bit lines BLa4, BLb4 are alternately arranged under the memory arrays 10a and the memory array 10b. In these embodiments, the sense amplifiers SA can be arranged within a length of the memory arrays 10a, 10b (e.g., a dimension of the memory arrays 10a, 10b measured along the direction Y), while keeping proper spacing between adjacent sense amplifiers SA.

The bit lines BL are routed to the sense amplifiers SA by some of the routing elements 212 as described with reference to FIG. 2B. In some embodiments, these routing elements 212 may include input lines 212a of the sense amplifiers SA; connection lines 212b running between the bit lines BL and the input lines 212a; conductive vias 212c extending between the input lines 212a and the connection lines 212b; and conductive vias 212d extending between the connection lines 212b and the bit lines BL. The input lines 212a and the connection lines 212b extend laterally, while the conductive vias 212c, 212d extend along a vertical direction.

The input lines 212a are connected to inputs of the sense amplifiers SA. Each bit line BL of the memory array 10a and one of the bit lines BL of the memory array 10b are routed to a pair of the input lines 212a. An extending direction of the input lines 212a may be substantially identical with an extending direction of the bit lines BL. For instance, the input lines 212a and the bit lines BL both extend along the direction X. In addition, the input lines 212a and the bit lines BL may be arranged along the same direction, such as the direction Y. As each sense amplifier SA is connected with two of the input lines 212a, the input lines 212a may be regarded as being arranged in pairs. In those embodiments where the sense amplifiers SA are arranged at opposite sides of the spacing S between the memory arrays 10a, 10b, adjacent sense amplifiers SA can be ensured to have sufficient spacing in between, without increasing spacing between adjacent input lines 212a.

Each pair of the input lines 212a are connected to a pair of the overlying connection lines 212b through two of the conductive vias 212c, and these connection lines 212b are connected to one of the bit lines BL in the memory array 10a and one of the bit lines BL in the memory array 10b through two of the conductive vias 212d. The input lines 212a in a pair may be laterally spaced apart from each other along a first direction, while the bit lines BL routed to these two input lines 212a are aligned and laterally spaced apart along a second direction intersected with the first direction. As a consequence, at least one of these two input lines 212a is/are laterally offset from the corresponding bit line BL along the second direction. The connection lines 212b are designed for compensating such lateral offset. For instance, the input lines 212a connected to the sense amplifier SA1 are laterally spaced apart along the direction Y, and the corresponding bit lines BLa1, BLb1 aligned and laterally spaced apart along the direction X are both laterally offset from these input lines 212a along the direction Y. In order to compensate such lateral offset, the connection lines 212b running between these input lines 212a and the bit lines BLa1, BLb1 extend along the direction Y, and the conductive vias 212c, 212d connected to each of these connection lines 212b are laterally spaced apart along the direction Y. Further, a lateral offset between the conductive vias 212c, 212d connecting to one of the connection lines 212b in a pair may be greater than a lateral offset between the conductive vias 212c, 212d connecting to the other one of the connection lines 212b in the pair. For instance, a lateral offset between the conductive vias 212c, 212d extending from the bit line BLa1 and one of the input lines 212a connecting to the sense amplifier SA1 is greater than a lateral offset between the conductive vias 212c, 212d extending from the bit line BLb1 and the other one of the input lines 212a connecting to the sense amplifier SA1. The connection lines 212b should be long enough to ensure that the lateral offset between each input line 212a and the corresponding bit line BL can be compensated. In other words, a length $L_{212b}$ of each connection line 212b along the direction Y must be greater than a pitch $P_{212a}$ of the input lines 212a. Further, in some embodiments, the connection lines 212b have the same length. In alternative embodiments, one of the connection lines 212b in each pair is longer than the other connection line 212b.

Each bit line BL in the memory array 10a and one of the bit lines BL in the memory array 10b routed to the same sense amplifier SA may be aligned with each other, and have a line break B in between. The line breaks B between the bit lines BL of the memory array 10a and the bit lines BL of the memory array 10b are within the spacing S between the memory arrays 10a, 10b. In some embodiments, the line breaks B arranged along the direction Y are offset from a central line CL (imaginary) of the spacing S, and are alternately approximate to the memory array 10a and the memory array 10b with respect to the central line CL. For instance, the line break B between the bit lines BLa1, BLb1 and the line break B between the bit lines BLa3, BLb3 are closer to the memory array 10b than the central line CL, while the line break B between the bit lines BLa2, BLb2 and the line break B between the bit lines BLa4, BLb4 are closer to the memory array 10a than the central line CL. In these embodiments, two of the connection lines 212b connected to a pair of the bit lines BL and two of the connection lines 212b connected to an adjacent pair of the bit lines BL can be laterally spaced apart along a direction intersected with an extending direction of the connection lines 212b. As a result, the connection lines 212b can be arranged within a length of the memory arrays 10a, 10b (e.g., a dimension of the memory arrays 10a, 10b measured along the direction Y), while keeping sufficient spacing between adjacent connection lines 212b. For instance, the connection lines 212b extend along the direction Y, while two of the connection lines 212b connected to the bit lines BLa1, BLb1 may be laterally spaced apart from the connection lines 212b connected to the bit lines BLa2, BLb2 along the direction X. Similarly, two of the connection lines 212b connected to the bit lines BLa3, BLb3 may be laterally spaced apart from the connection lines 212b connected to the bit lines BLa4, BLb4 along the direction X.

Figure 2D:
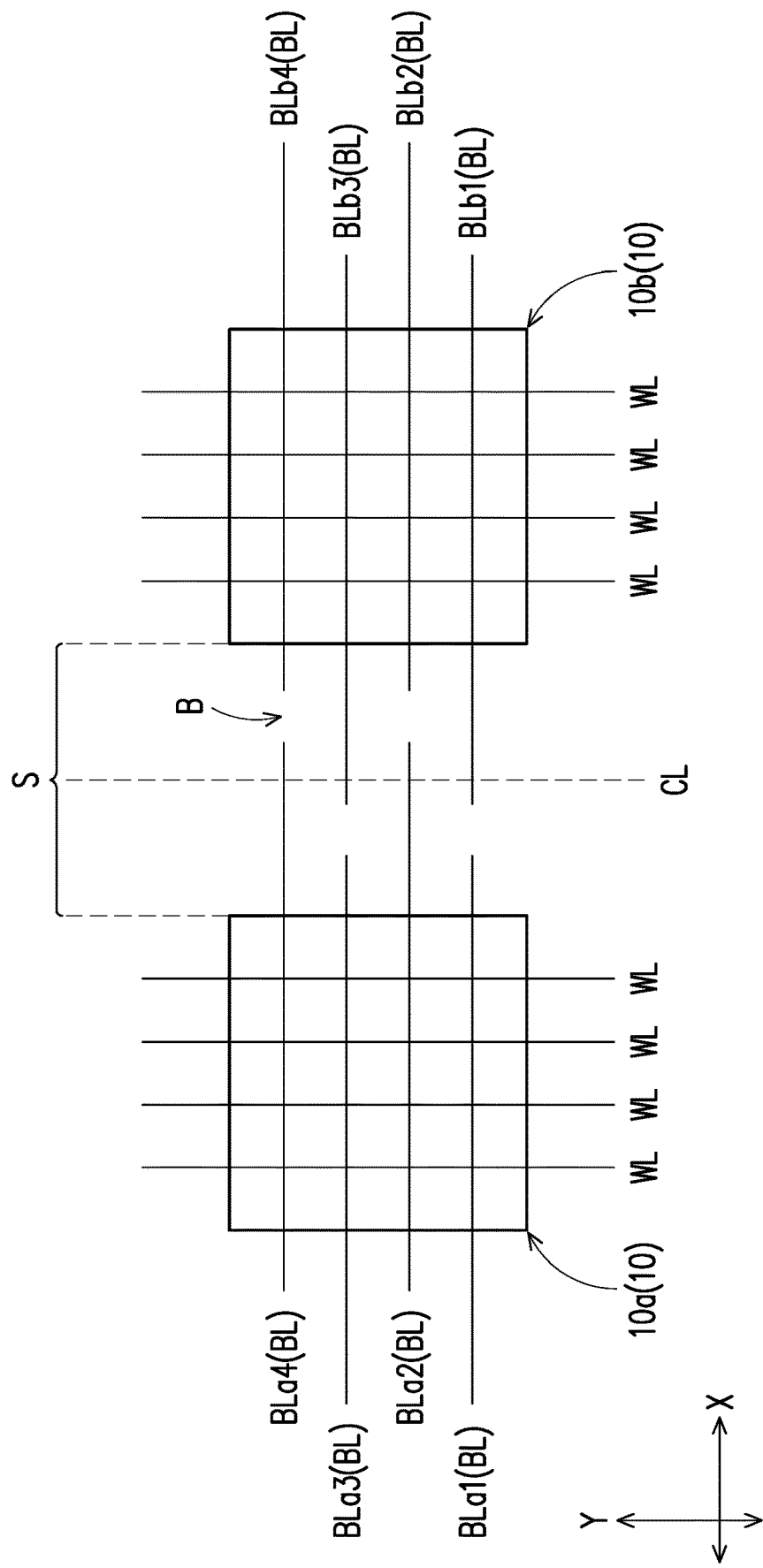
FIG. 2D is another view schematically illustrating the bit lines in the adjacent memory arrays, according embodiments described with reference to FIG. 2C.

FIG. 2D is another view schematically illustrating the bit lines BL of adjacent ones of the memory arrays 10, according embodiments described with reference to FIG. 2C.

Referring to FIG. 2C and FIG. 2D, in those embodiments where the line breaks B between the bit lines BL of the memory array 10a and the bit lines BL of the memory array 10b are alternately approximate to the memory arrays 10a, 10b with respect to the central line CL of the spacing S between the memory arrays 10a, 10b, the bit lines BL in each memory array 10 may be regarded as alternately shifting toward opposite sides of the memory array 10. For instance, the bit lines BLa1, BLa3 in the memory array 10a may be regarded as shifting toward a left side of the memory array 10a as shown in FIG. 2D, while the bit lines BLa2, BLa4 in the memory array 10a may be regarded as shifting toward a right side of the memory array 10a. Similarly, the bit lines BLb1, BLb3 in the memory array 10b may be regarded as shifting toward a left side of the memory array 10b as shown in FIG. 2D, while the bit lines BLb2, BLb4 in the memory array 10b may be regarded as shifting toward a right side of the memory array 10b. In addition to the bit lines BL, the word lines WL intersecting with the bit lines BL are also shown in FIG. 2D.

Figure 3:
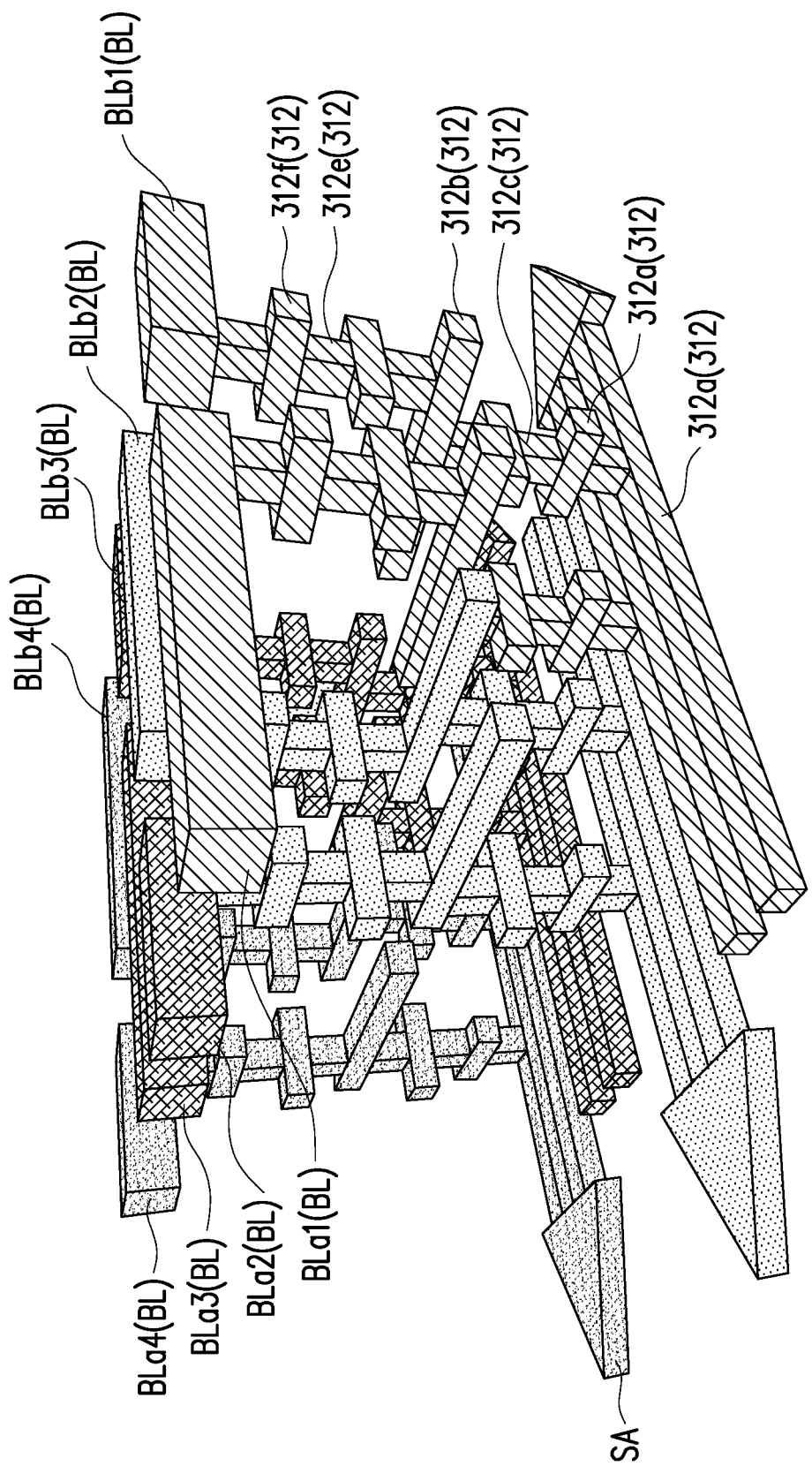
FIG. 3 is a schematic three-dimensional view illustrating routing elements for connecting the bit lines to the sense amplifiers, according to alternative embodiments of the present disclosure.

FIG. 3 is a schematic three-dimensional view illustrating routing elements 312 for connecting the bit lines BL to the sense amplifiers SA, according to alternative embodiments of the present disclosure.

Referring to FIG. 3, the routing elements 312 spreading between the bit lines BL and the sense amplifiers SA include input lines 312a, connection lines 312b, as similar to the input lines 212a and the connection lines 212b described with reference to FIG. 2C. Further, the routing elements 312 include conductive vias 312c and conductive pads/lines 312d disposed between the input lines 312a and the connection lines 212b. The conductive vias 312c extend along a vertical direction, while the conductive pads/lines 312d extend laterally. Each conductive pad/line 312d is disposed between vertically adjacent conductive vias 312c, and are electrically connected to these conductive vias 312c. The bottommost conductive vias 312c stand on the input lines 312a, while the topmost conductive vias 312c reach to the connection lines 312b. As an example, two layers of the conductive pads/lines 312d as well as the conductive vias 312c at top and bottom sides of each conductive pad/line 312d are disposed between the input lines 312a and the connection lines 312b. However, more or less layer(s) of the conductive pads/lines 312d as well as the conductive vias 312c at top and bottom sides of each conductive pad/line 312d can be formed between the input lines 312a and the connection lines 312b, the present disclosure is not limited to a stacking height of the conductive vias 312c and the conductive pads/lines 312d.

Similarly, the routing elements 312 include conductive vias 312e and conductive pads/lines 312f disposed between the connection lines 212b and the bit lines BL. The conductive vias 312e extend along a vertical direction, while the conductive pads/lines 312f extend laterally. Each conductive pad/line 312f is disposed between vertically adjacent conductive vias 312e, and are electrically connected to these conductive vias 312e. The bottommost conductive vias 312e stand on the connection lines 312b, while the topmost conductive vias 312e reach to the bit lines BL. As an example, two layers of the conductive pads/lines 312f as well as the conductive vias 312e at top and bottom sides of each conductive pad/line 312f are disposed between the connection lines 312b and the bit lines BL. However, more or less layer(s) of the conductive pads/lines 312f as well as the conductive vias 312e at top and bottom sides of each conductive pad/line 312f can be formed between the connection lines 312b and the bit lines BL, the present disclosure is not limited to a stacking height of the conductive vias 312e and the conductive pads/lines 312f.

Figure 4A:
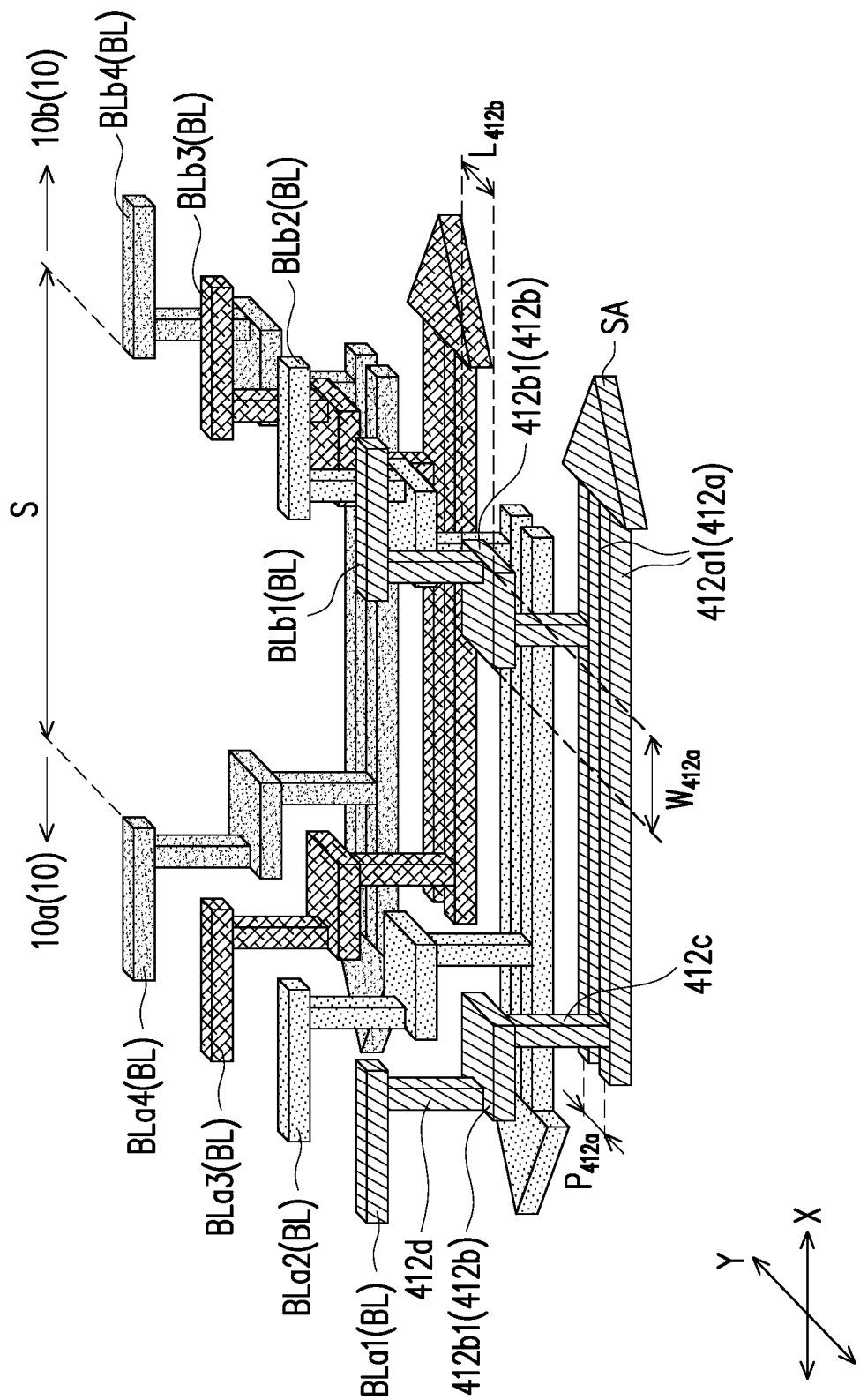
FIG. 4A is a schematic three-dimensional view illustrating routing elements for connecting the bit lines to the sense amplifiers, according to other embodiments of the present disclosure.

FIG. 4A is a schematic three-dimensional view illustrating routing elements 412 for connecting the bit lines BL to the sense amplifiers SA, according to other embodiments of the present disclosure.

Referring to FIG. 4A, the routing elements 412 spreading between the bit lines BL and the sense amplifiers SA include input lines 412a, as similar to the input lines 212a described with reference to FIG. 2C. In addition, the routing elements 412 further include connection pads 412b arranged between the input lines 412a and the bit lines BL; conductive vias 412c vertically extending between the input lines 412a and the connection pads 412b; and conductive vias 412d vertically extending between the connection pads 412b and the bit lines BL. As similar to the routing scheme as described with reference to FIG. 2C, each bit line BL in the memory array 10a and one of the bit lines BL in the memory array 10b are routed to a pair of the input lines 412a through the connection pads 412b in between, along with conductive vias 412c, 412d at top and bottom sides of these connection pad 412b. For instance, the bit line BLa1 is routed to one of the input lines 412a in a pair (referred as input lines 412a1) through the connection pad 412b in between (referred as a connection pad 412b1), along with the conductive vias 412c, 412d at top and bottom sides of the connection pad 412b1. In addition, the bit line BLb1 is routed to the other input line 412a1 in the pair through the connection pad 412b in between (referred as another connection pad 412b1), along with the conductive vias 412c, 412d at top and bottom sides of this connection pad 412b1.

Each connection pad 412b is overlapped with one of the bit lines BL and the corresponding input line 412a. As similar to the embodiments described with reference to FIG. 2C, some of the bit lines BL may be laterally offset from the corresponding input lines 412a along a direction in which the bit lines BL and the input lines 412a are arranged (e.g., the direction Y). Each connection pad 412b may have a length (a dimension measured along the direction in which the bit lines BL and the input lines 412a are arranged (e.g., the direction Y)) $L_{412b}$ equal to or greater than such lateral offset. Accordingly, by adjusting a lateral offset between the conductive vias 412c, 412d extending from a connection pad 412b to the corresponding bit line BL and input line 412a, the lateral offset between the bit line BL and the input line 412a can be compensated. In some embodiments, the length $L_{412b}$ is no less than a pitch $P_{412a}$ of the input lines 412a. As a consequence that the length $L_{412b}$ is equal to or greater than the pitch $P_{412a}$, at least some of the connection pads 412b may respectively overlap a pair of the input lines 412a.

In addition, a width $W_{412b}$ of each connection pad 412b measured along an extending direction of the bit lines BL and the input lines 412a may be great enough that the conductive vias 412c, 412d connected to each connection pad 412b can be laterally spaced apart along such extending direction. Those skilled in the art may modify a ratio of the length $L_{412b}$ over the width $W_{412b}$ according to process or design requirements, the present disclosure is not limited thereto. Since the connection pad 412b spans along both of the direction in which the bit lines BL and the input lines 412a are arranged and the direction in which the bit lines BL and the input lines 412a extend, they are in two-dimensional shapes (e.g., pad shaped), rather than one-dimensional shapes (e.g., line shapes). For instance, the connection pads 412b may be formed in rectangular shapes. However, the connection pads 412b can be formed in other two-dimensional shapes, the present disclosure is not limited to shapes and dimensions of the connection pads 412b.

The connection pads 412b may be separately arranged along the direction in which the bit lines BL and the input lines 412a are arranged. For instance, the connection pads 412b for routing the bit lines BL in the memory arrays 10a, 10b are arranged in two separate columns extending along the direction Y. One of these columns of the connection pads 412b may extend along a boundary of the memory array 10a, while the other column of the connection pads 412b may extend along a boundary of the memory array 10b. Further, the connection pads 412b connected to the same pair of the input lines 412a may be substantially aligned along the direction in which the bit lines BL and the input lines 412a extend. For instance, the connection pads 412b1 connected to the input lines 412a1 are laterally spaced apart and substantially aligned along the direction X.

In those embodiments where the bit lines BL are routed through the connection pads 412b, end portions of the bit lines BL in each memory array 10 may be substantially aligned with one another. For instance, the bit lines BLa1-BLa4 in the memory array 10a may have end portions substantially aligned along the direction Y. Similarly, the bit lines BLb1-BLb4 in the memory array 10b may have end portions substantially aligned along the direction Y. As a consequence of the end portions of the bit lines BL in each memory array 10 are substantially aligned with one another, a line break between the bit lines BL routed to the same pair of the input lines 412a may span across a central line of the spacing S between the memory arrays 10.

Figure 4B:
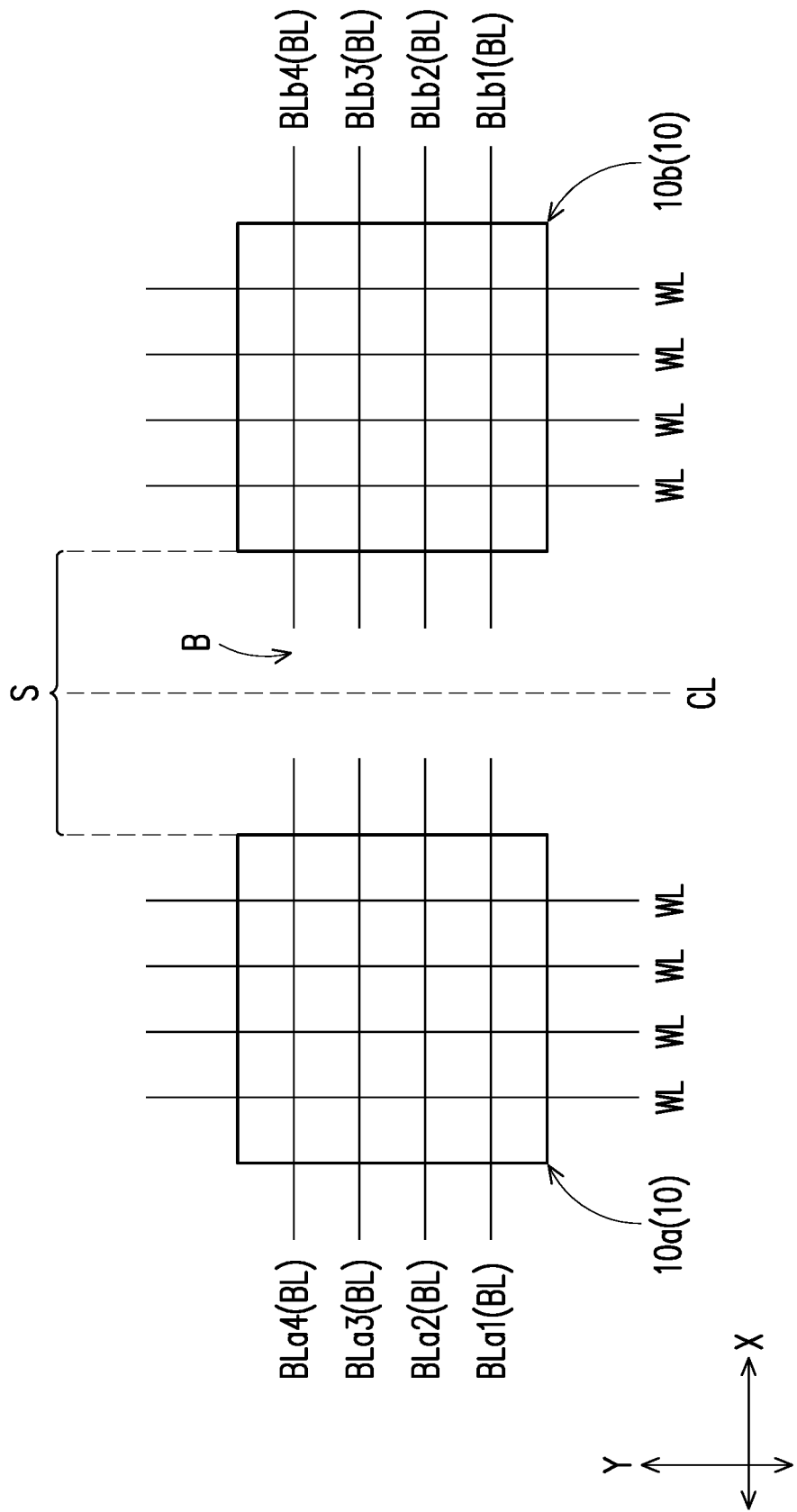
FIG. 4B is another view schematically illustrating the bit lines in the adjacent memory arrays, according to embodiments described with reference to FIG. 4A.

FIG. 4B is another view schematically illustrating the bit lines BL of adjacent ones of the memory arrays 10, according to embodiments described with reference to FIG. 4A.

Referring to FIG. 4A and FIG. 4B, the bit lines BLa1-BLa4 in the memory array 10a may be arranged along the direction Y without alternately shifting along the direction X. Similarly, the bit lines BLb1-BLb4 in the memory array 10b may be arranged along the direction Y without alternately shifting along the direction X. As a result, the line breaks B between the bit lines BLa1-BLa4 and the bit lines BLb1-BLb4 may be substantially aligned along the direction Y. In addition, the breaks B may span across the central line BL of the spacing S between the memory arrays 10a, 10b.

Although not shown, the embodiments as described with reference to FIG. 4A and FIG. 4B may have variations. For instance, the conductive vias 412c described with reference to FIG. 4A may be alternatively replaced by the conductive vias 312c and the conductive pads/lines 312d as described with reference to FIG. 3, and/or the conductive vias 412d described with reference to FIG. 4A may be alternatively replaced by the conductive vias 312e and the conductive pads/lines 312f as described with reference to FIG. 3.

As above, the memory integrated circuit according to embodiments of the present disclosure includes a driving circuit lying below memory arrays. Since the driving circuit is placed below the memory arrays rather than being placed between the memory arrays, a spacing between adjacent memory arrays can be reduced, and the memory arrays can be further scaled down. Accordingly, a storage capability of the memory arrays in a given area may be increased. Further, sense amplifiers in the driving circuit for facilitating read operation of adjacent memory arrays may be alternately arranged under these adjacent memory arrays along boundaries of these adjacent memory arrays that are facing each other. As a result, these sense amplifiers can be arranged within a length of the memory arrays along an extending direction of the boundaries, while keeping proper spacing in between. In regarding a routing scheme for connecting bit lines in the memory arrays to the sense amplifiers in the driving circuit, connection patterns are deployed between the memory arrays and input lines of the sense amplifiers. The connection patterns can compensate lateral offset between the bit lines and the input lines, and allow greater flexibility in designing the driving circuit.

In an aspect of the present disclosure, a memory integrated circuit is provided. The memory integrated circuit comprises: a first memory array, a second memory array and a driving circuit. The first and second memory arrays are laterally spaced apart from each other, and respectively comprise: memory cells, each comprising an access transistor and a storage capacitor coupled to the access transistor; bit lines, respectively coupled to a row of the memory cells; and word lines, respectively coupled to a column of the memory cells. The driving circuit is disposed below the first and second memory arrays, and comprises sense amplifiers. Each of the bit lines in the first memory array and one of the bit lines in the second memory array are routed to input lines of one of the sense amplifiers.

In another aspect of the present disclosure, a memory integrated circuit is provided. The memory integrated circuit comprises: a first DRAM array and a second DRAM array, laterally spaced apart from each other; a driving circuit disposed below the first and second DRAM arrays, and comprising sense amplifiers; and routing elements, connecting bit lines of the first and second DRAM arrays to input lines of the sense amplifiers, and comprising connection patterns laterally extending between the driving circuit and the first and second DRAM arrays above the driving circuit, wherein the input lines and the bit lines extend along a first direction, the connection patterns each have a length along a second direction, and the length is equal to or greater than a pitch of the input lines.

In yet another aspect of the present disclosure, a memory integrated circuit is provided. The memory integrated circuit comprises: a driving circuit, a first memory array, a second memory array and routing elements. The driving circuit is formed on a surface of a semiconductor substrate, and comprises sense amplifiers. The first and second memory arrays are formed in a stack of interlayer dielectric layers lying over the semiconductor substrate, and are laterally spaced apart from each other. Each of the first and second memory arrays comprises: memory cells, each comprising an access transistor and a storage capacitor; bit lines, respectively coupled to a row of the memory cells; and word lines, respectively coupled to a column of the memory cells. The routing elements are formed in the stack of interlayer dielectric layers, and connect the bit lines of the first and second memory arrays to input lines of the sense amplifiers disposed below the first and second memory arrays.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory integrated circuit, comprising:

a first memory array and a second memory array, laterally spaced apart from each other, and respectively comprising:
    memory cells, each comprising an access transistor and a storage capacitor coupled to the access transistor;
    bit lines, respectively coupled to a row of the memory cells; and
    word lines, respectively coupled to a column of the memory cells; and
a driving circuit, disposed below the first and second memory arrays, and comprising sense amplifiers, wherein each of the bit lines in the first memory array and one of the bit lines in the second memory array are routed to input lines of one of the sense amplifiers,
wherein the first and second memory arrays are disposed at the same height with a spacing in between, and the bit lines coupled to the memory cells of the first and second memory arrays are connected to the input lines of the sense amplifiers through the spacing.

2. The memory integrated circuit according to claim 1, wherein the sense amplifiers comprise transistors formed at a surface of a semiconductor substrate, and the access transistors of the memory cells lie over the transistors of the sense amplifiers.

3. The memory integrated circuit according to claim 2, wherein channel layers of the access transistors are formed of an oxide semiconductor material.

4. The memory integrated circuit according to claim 1, wherein the sense amplifiers are arranged along boundaries of the first and second memory arrays that are facing each other.

5. The memory integrated circuit according to claim 4, wherein the sense amplifiers are alternately arranged at opposite sides of the spacing extending between the first and second memory arrays.

6. The memory integrated circuit according to claim 5, wherein the sense amplifiers are each overlapped with the first memory array or the second memory array.

7. A memory integrated circuit, comprising:
a first DRAM array and a second DRAM array, disposed at the same height, and laterally spaced apart from each other by a spacing in between;
a driving circuit disposed below the first and second DRAM arrays, and comprising sense amplifiers; and
routing elements, connecting bit lines of the first and second DRAM arrays to input lines of the sense amplifiers through the spacing, and comprising connection patterns laterally extending between the driving circuit and the first and second DRAM arrays above the driving circuit, wherein the input lines and the bit lines extend along a first direction, the connection patterns each have a length along a second direction, and the length is equal to or greater than a pitch of the input lines.

8. The memory integrated circuit according to claim 7, wherein the connection patterns are formed in line shapes extending along the second direction.

9. The memory integrated circuit according to claim 8, wherein the routing elements further comprise conductive vias, and two of the conductive vias at the top and bottom sides of each connection pattern are laterally spaced apart along the second direction.

10. The memory integrated circuit according to claim 7, wherein the connection patterns are formed in pad shapes each extending along both of the first and second directions.

11. The memory integrated circuit according to claim 10, wherein the routing elements further comprise conductive vias, and two of the conductive vias at the top and bottom sides of each connection pattern are laterally spaced apart along both of the first and second directions.

12. The memory integrated circuit according to claim 7, wherein the bit lines of the first DRAM array are substantially aligned with the bit lines of the second DRAM array respectively, and line breaks between the bit lines of the first DRAM array and the bit lines of the second DRAM array are substantially aligned along the second direction.

13. The memory integrated circuit according to claim 12, wherein the connection patterns connected to the bit lines of the first DRAM array are substantially aligned along the second direction, and the connection patterns connected to the bit lines of the second DRAM array substantially aligned along the second direction.

14. The memory integrated circuit according to claim 7, wherein the bit lines of the first DRAM array are substantially aligned with the bit lines of the second DRAM array respectively, a first group of the bit lines of the first DRAM array are laterally spaced apart from a first group of the bit lines of the second DRAM array by first line breaks, a second group of the bit lines of the first DRAM array are laterally spaced apart from a second group of the bit lines of the second DRAM array by second line breaks, and the first line breaks are laterally offset from the second line breaks along the first direction.

15. The memory integrated circuit according to claim 14, wherein the bit lines of the first groups and the bit lines of the second groups are alternately arranged along the second direction.

16. The memory integrated circuit according to claim 14, wherein the connection patterns connected to the bit lines of the first groups are laterally spaced apart from the connection patterns connected to the bit lines of the second groups along the first direction.

17. A memory integrated circuit, comprising:
a driving circuit, formed on a surface of a semiconductor substrate, and comprising sense amplifiers;
a first memory array and a second memory array, formed in a stack of interlayer dielectric layers lying over the semiconductor substrate, and are laterally spaced apart from each other at the same height, wherein each of the first and second memory arrays comprises:
    memory cells, each comprising an access transistor and a storage capacitor;
    bit lines, respectively coupled to a row of the memory cells; and
    word lines, respectively coupled to a column of the memory cells; and
routing elements, formed in the stack of interlayer dielectric layers, and connecting the bit lines of the first and second memory arrays to input lines of the underlying sense amplifiers through portions of the interlayer dielectric layers extending in between the first and second memory arrays.

18. The memory integrated circuit according to claim 17, wherein the access transistor in each memory cell comprises:
a back gate layer, connected to one of the word lines running below the back gate layer;
a gate dielectric layer, disposed on the back gate layer;
a channel layer, disposed on the gate dielectric layer; and
a pair of source/drain structures, separated formed on the channel layer, and connected to one of the bit lines and one of the storage capacitors, respectively.

19. The memory integrated circuit according to claim 18, wherein the bit lines lie between the access transistors and the storage capacitors of the memory cells.

20. The memory integrated circuit according to claim 18, wherein one of the stack of interlayer dielectric layers has separate openings, bottom electrode layers of the storage capacitors are separately filled in the openings, a common dielectric layer of the storage capacitors conformally covers the one of the stack of interlayer dielectric layer and the bottom electrode layers, and a common top electrode of the storage capacitors globally covers the common dielectric layer.

\* \* \* \* \*